United States Patent
Lee et al.

(10) Patent No.: US 7,670,128 B2
(45) Date of Patent: Mar. 2, 2010

(54) APPARATUS FOR FORMING FINE PATTERN ON SUBSTRATE

(75) Inventors: Young-Chul Lee, Yongin-si (KR); Yong-Seok Park, Seoul (KR); Kyoung-Heon Heo, Hwaseong-si (KR); Yeon Ju, Suwon-si (KR)

(73) Assignee: DMS Co., Ltd. (KR)

( * ) Notice: Subject to any disclaimer, the term of this patent is extended or adjusted under 35 U.S.C. 154(b) by 1098 days.

(21) Appl. No.: 11/319,637

(22) Filed: Dec. 28, 2005

(65) Prior Publication Data

US 2006/0196415 A1    Sep. 7, 2006

(30) Foreign Application Priority Data

Mar. 7, 2005    (KR) .................. 10-2005-0018738

(51) Int. Cl.
*B29C 59/00*    (2006.01)

(52) U.S. Cl. .................. 425/385; 425/174.4; 264/293

(58) Field of Classification Search .................. 425/385, 425/174.4, 387.1; 264/293
See application file for complete search history.

(56) References Cited

U.S. PATENT DOCUMENTS

| | | | |
|---|---|---|---|
| 5,772,905 A | | 6/1998 | Chou |
| 5,947,027 A * | | 9/1999 | Burgin et al. ............... 101/474 |
| 6,696,220 B2 * | | 2/2004 | Bailey et al. ................ 425/385 |
| 2002/0132482 A1 | | 9/2002 | Chou |
| 2003/0159608 A1 | | 8/2003 | Heidari |
| 2003/0189273 A1 * | | 10/2003 | Olsson ....................... 264/293 |
| 2004/0131718 A1 * | | 7/2004 | Chou et al. .................. 425/385 |

FOREIGN PATENT DOCUMENTS

| | | |
|---|---|---|
| CN | 1293534 | 5/2001 |
| JP | 02-126434 | 5/1990 |
| JP | 04-333035 | 11/1992 |
| JP | 10-180893 | 7/1998 |
| JP | 2000-323461 | 11/2000 |
| JP | 2003-516644 | 5/2003 |
| JP | 2004-288804 | 10/2004 |
| JP | 2006-516065 | 6/2006 |
| KR | 1020030097735 | 12/2003 |
| WO | WO 0142858 | 6/2001 |
| WO | WO 03090985 | 11/2003 |
| WO | 2004/013693 | 2/2004 |

OTHER PUBLICATIONS

English Abstract of Chinese Publication No. CN1293534, 2001.

(Continued)

*Primary Examiner*—Maria Veronica D Ewald
(74) *Attorney, Agent, or Firm*—Barnes & Thornburg LLP (57) ABSTRACT

An apparatus of forming a fine pattern includes a chamber having a predetermined process space, a stage for supporting a substrate on which a photosensitive organic layer is formed, using buoyancy, a template disposed away from the stage to imprint a preprocess pattern dividing etching and non-etching regions on the organic layer of the substrate, and a driving unit for moving the stage toward the template so that the pattern formed on the template can be formed on the organic layer of the substrate.

8 Claims, 6 Drawing Sheets

OTHER PUBLICATIONS

English Abstract of Korean Publication No. 1020030097735, 2003.
English Abstract of Japanese Publication No. 2004-288804, 2004.
English Abstract of Japanese Publication No. 02-126434, 1990.
English Abstract of Japanese Publication No. 10-180893, 1998.
English Abstract of Japanese Publication No. 04-333035, Nov. 20, 1992.
Patent Abstracts of Japan, 2000-323461 Published Nov. 24, 2000.

* cited by examiner

APPARATUS FOR FORMING FINE PATTERN ON SUBSTRATE

CROSS-REFERENCE TO RELATED APPLICATION

This application claims priority to and the benefit of Korean Patent Application No. 10-2005-0018738, filed in the Korean Intellectual Property Office on Mar. 7, 2005, the entire content of which is incorporated herein by reference.

BACKGROUND OF THE INVENTION

1. Field of the Invention

The present invention relates to an apparatus for forming a fine pattern on a substrate, and more particularly, to an apparatus for stably forming a fine pattern on a substrate by uniformly applying pressure to a substrate by disposing the substrate on a stage filled with fluid during the imprint process.

2. Description of the Related Art

Generally, a thin film transistor (TFT) has a multi-layered structure in which a gate wiring layer, a semiconductor layer, a resistance contact layer, a conductive layer and the like are stacked on one another.

Particularly, the gate wiring layer is usually formed through a photolithography process using photosensitive resin. That is, the photosensitive resin is applied on a portion of the substrate and a light exposure process is performed for the photosensitive resin layer using a mask dividing etching and non-etching areas, thereby forming a predetermined fine pattern.

However, the above-described prior wiring layer forming method goes through a variety of processes such as a process for forming a photosensitive organic layer by applying the photosensitive resin, a process for exposing the photosensitive organic layer, a process for etching the exposed portion, and the like. Furthermore, since the mask must be used for the light exposure process, it is hard to perform the work and detailed processes are complicated, thereby deteriorating the work and process efficiencies.

Therefore, in recent years, a method for directly imprinting a preprocess pattern at a predetermined thickness through physical contact on the photosensitive resin layer applied on the substrate without performing the light exposure process using the mask has been used. However, since such an imprint method leads to many defectives preprocess patterns according to the imprint posture or location and pressure distribution during the process for imprinting the preprocess pattern, and it is difficult to manufacture the imprinting equipment and set the equipment.

Particularly, in the method for imprinting the preprocess pattern through physical contact, small bubbles may be easily generated on the opposing contact surfaces. The bubbles generate bubble holes on the photosensitive resin layer, thereby deteriorating the imprinting quality. Therefore, if these problems are not solved, satisfactory quality and the improvement of the work efficiency cannot be expected.

U.S. Pat. No. 5,772,905 discloses a technology relating to nanoimprint lithography. In this patent, although one stationary stage and one movable stage are disclosed, means for solving the above problems are not disclosed.

SUMMARY OF THE INVENTION

Therefore, the present invention has been made in an effort to solve the above-described problems of the prior art.

Accordingly, it is an objective of the present invention to provide an apparatus for stably forming a fine pattern during an imprint process.

It is another objective of the present invention to provide an apparatus for effectively forming a fine pattern by automating an imprint process.

To achieve the above objects, the present invention provides an apparatus for forming a fine pattern that includes a chamber having a predetermined process space, a stage for supporting a substrate on which a photosensitive organic layer is formed, using buoyancy, a template disposed away from the stage to imprint a preprocess pattern dividing etching and non-etching regions on the organic layer of the substrate, and a driving unit for moving the stage toward the template so that the pattern formed on the template can be formed on the organic layer of the substrate.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

As shown in FIGS. 1 through 4, the inventive apparatus for forming a fine pattern includes a chamber 1 defining a predetermined space therein, a stage 2 having a pressure distributing unit for uniformly distributing pressure applied to a substrate G being loaded, and a template 4 for imprinting a preprocess pattern P1 on an organic layer T1 of the substrate G when the stage 2 disposed above the stage 2 ascends.

The apparatus for forming the fine pattern further includes a driving unit 6 such as a cylinder provided in the chamber 1 to vertically reciprocate the stage 2, an X-Y driving stage 8 for adjusting a location of the stage by moving the stage 2 in X and Y-directions, and a lamp 10 provided above the template 4 to irradiate light to the template 4 and the substrate G.

Figure 1:
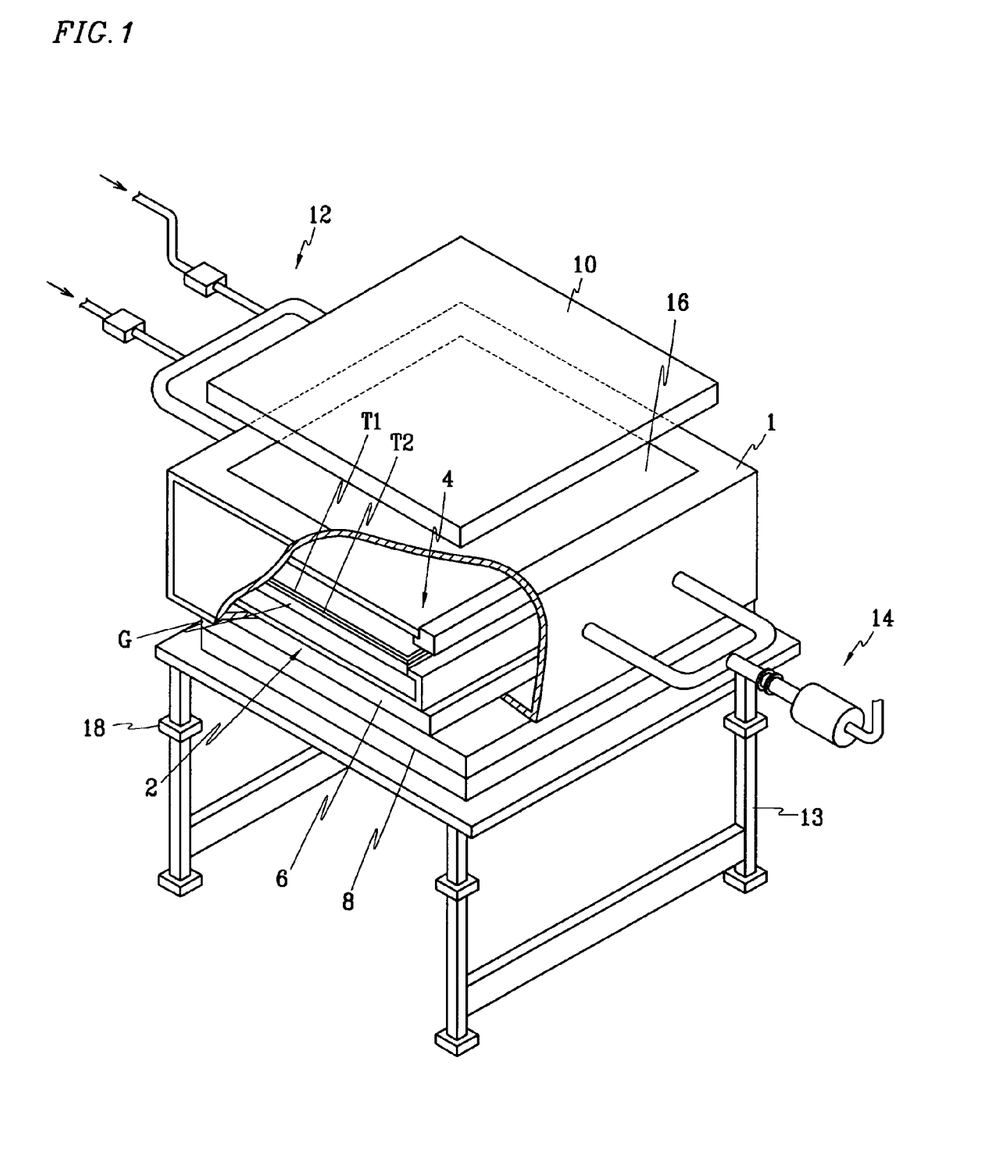
FIG. 1 is a perspective view of an apparatus for forming a fine pattern according to a preferred embodiment of the present invention.
Figure 2:
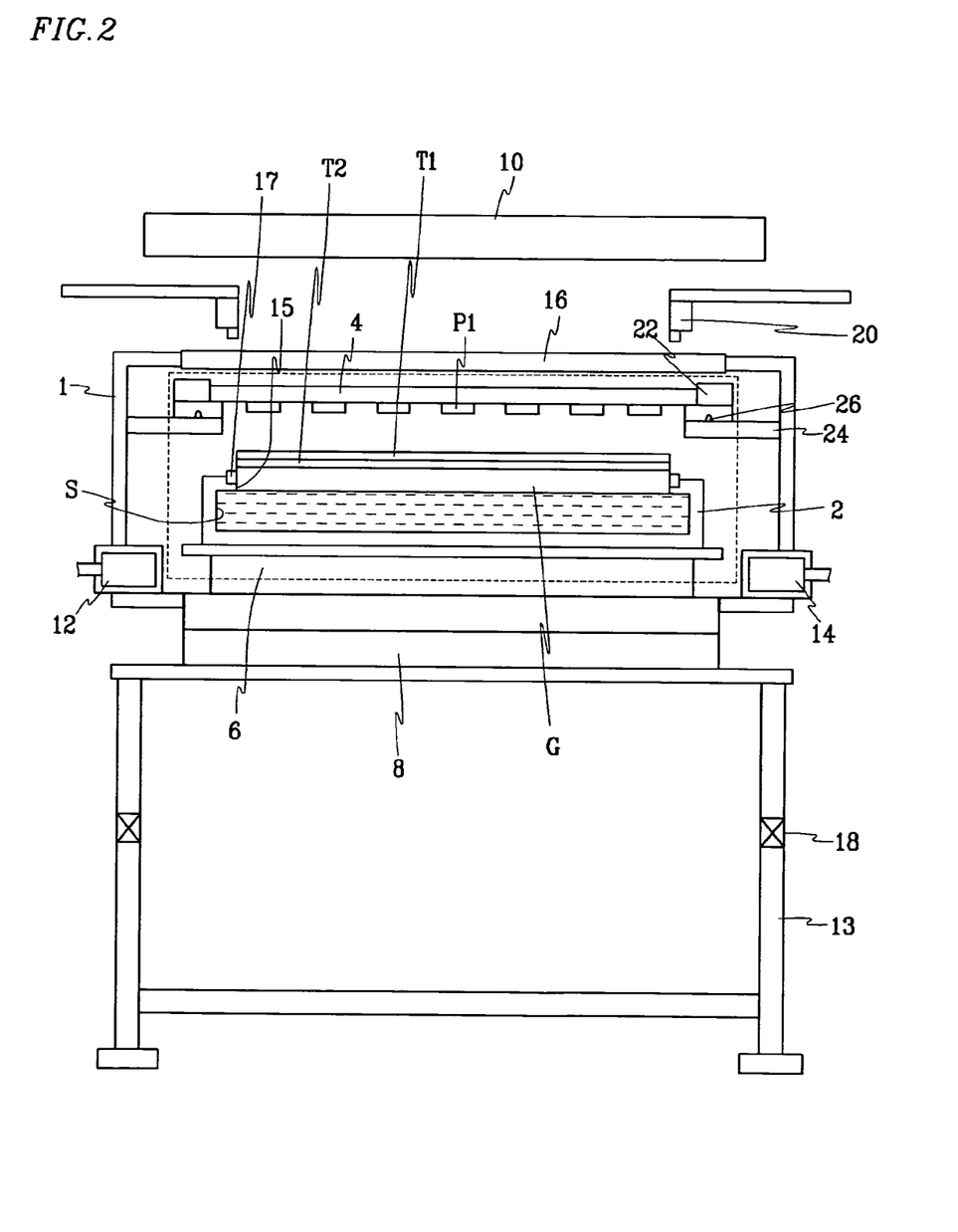
FIG. 2 is a view of an internal structure of an apparatus for forming a fine pattern illustrated in FIG. 1.

In the above-described apparatus, the chamber 1 defines a predetermined volume of an inner space. The chamber 1 may be formed in a hexahedron shape. The inner space of the chamber 1 may be structure to maintain a vacuum state if necessary.

That is, an intake unit 12 for injecting air or atmospheric gas into the chamber 1 may be connected to a side of the chamber 1, and an exhaust unit 14 for exhausting the air or atmospheric gas out of the chamber 1 may be connected to another side of the chamber.

Accordingly, in the imprint process for the substrate G, by properly operating the intake and exhaust units 12 and 14, the inside of the chamber 1 can be maintained in a vacuum state. When the inside of the chamber 1 is maintained in the vacuum state, the generation of bubbles on the organic layer of the substrate can be minimized during the imprint process.

A filter for filtering dust that may be introduced when the air is introduced into the chamber may be installed to the intake unit 12.

A transparent window 16 is provided at a top surface of the chamber 1 so that the light irradiated from the lamp 10, i.e., a UV lamp, can transmit through the same. The transparent window may be formed of quartz.

Therefore, the light transmitting through the window 16 is irradiated to the substrate G on which the organic layer T1 is formed after passing through the template 4, thereby hardening the organic layer T1 to form the fine pattern.

A door (not shown) through which the substrate is introduced into the chamber 1 is installed on the chamber 1. That is, the substrate G is loaded on the stage 2 by a conveyer unit or a robot through the door.

A video camera 20 is provided above the chamber 1 by a predetermined distance. When a substrate loading location signal taken by the camera 20 is inputted to a control unit (not shown), the control unit controls the movement of the X-Y driving table 8 when a location correction of the substrate is necessary.

A plurality of frames 13 each having a predetermined length are installed on a lower portion of the chamber 1 so that a height of the chamber 1 can be properly adjusted. Each of the frames 13 has a buffer 18 such as a shock absorber to absorb vibration that may be generated during the fine pattern forming process.

The stage 2 is filled with fluid such as oil to uniformly distribute pressure on the substrate loaded on the stage. That is, the substrate is supported by buoyancy of the fluid filled in the stage 2.

Figure 3:
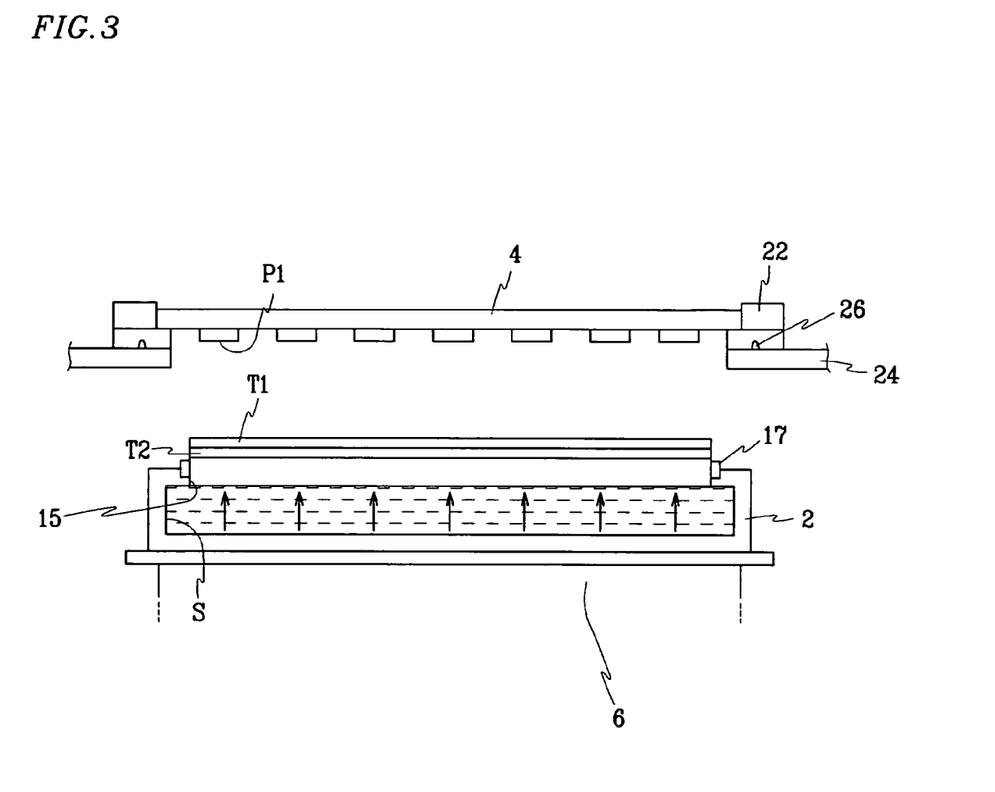
FIG. 3 is an enlarged view of a portion "A" of FIG. 1.

To realize the above, as shown in FIGS. 2 and 3, the stage 2 has an inner space S in which the fluid can be filled. The stage 2 is provided at an upper portion with an opening 15 through which the fluid contacts the substrate G. A clamp 17 is provided around the opening 15 to fix the substrate G.

An additional plate member may be provided on the opening 15 side so that the fluid does not directly contact the substrate G.

The structure of the stage 2 is not limited to the above-described structure. Any structures that can support the substrate using fluid will be possible. For example, the base itself may be formed to contain the fluid and support the substrate.

Meanwhile, the template 4 may be formed in a conventional structure including a mold on which the fine pattern is formed and a mold holding panel for fixing the mold. The template 4 is coupled to a jig bar 24 installed in the chamber 1 in a state where it is fixed on the holder 22. A holding pin 26 is projected on the jig bar 24 to be detachably inserted in the holder 22. After the setting is finished, the template 4 is not moved in any direction.

The mold is formed of soft transparent/semitransparent liquid synthetic resin, particularly, an aqueous urethane such as PDDP or PDMS that can be securely adhered to the panel. The panel may be formed of a glass panel or a plastic panel.

The mold has a predetermined thickness and a size that can cover the whole surface of the organic layer T1 of the substrate G. On a surface of the mold that faces the substrate G, a fine pattern P1 is formed that can divide the etching and non-etching regions.

Figure 4:
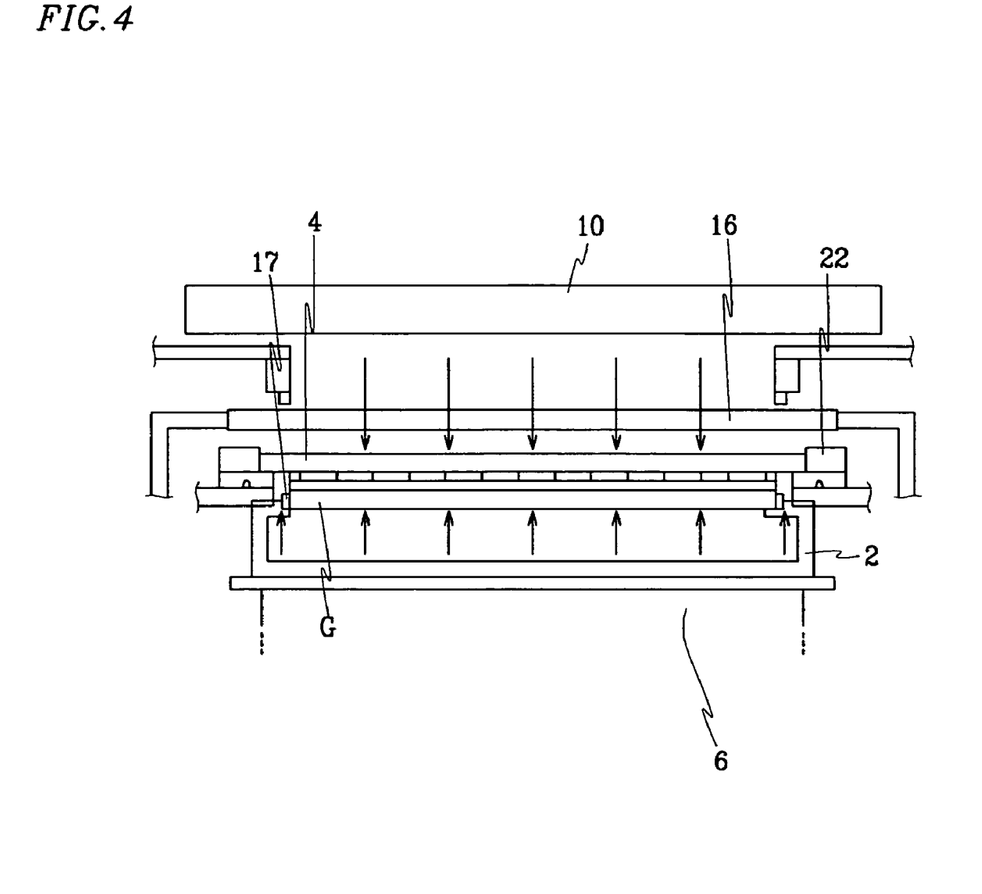
FIG. 4 is a view illustrating an imprint process for a substrate by an ascended fluid stage of an apparatus for forming a fine pattern.

Therefore, when the stage 2 ascends to allow the substrate G to contact the template 4, the substrate G can stably contact the template since the holder 22 holds the mold.

In addition, the lamp 10 may include a UV lamp. The lamp 10 irradiates the light to the substrate G in a state where the substrate G is imprinted on the template, thereby hardening the fine pattern.

The operation of the fine pattern forming apparatus will be described hereinafter.

As shown in FIG. 1 through FIG. 6B, the organic layer T1 is first applied on a surface of the substrate G to perform the imprint process for the substrate G.

Figure 6A:
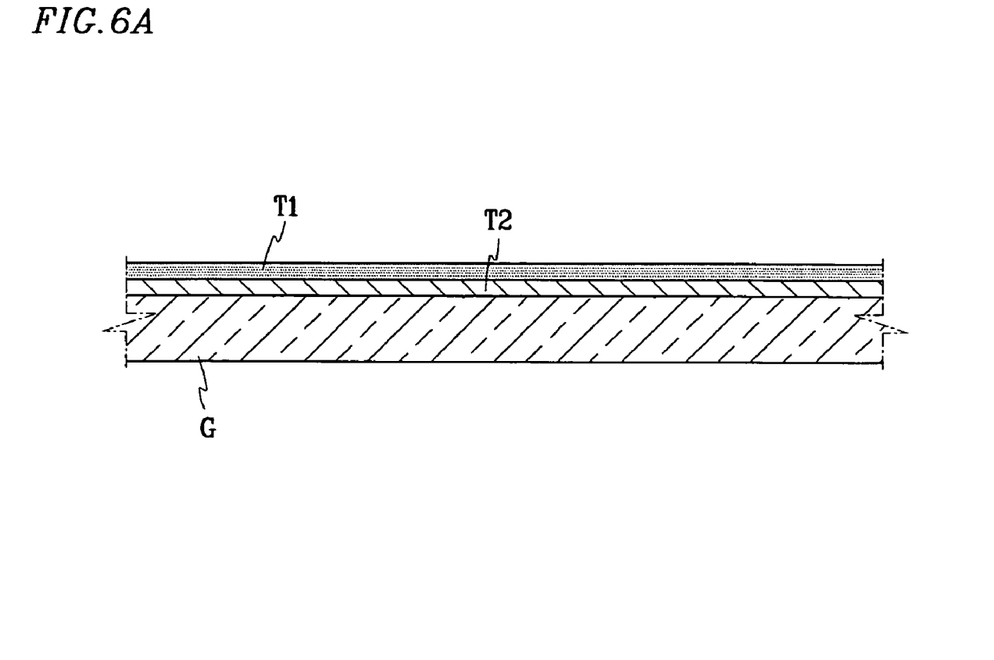
FIG. 6A is a sectional view of wiring and organic layers formed on a substrate before an imprint process is performed.
Figure 6B:
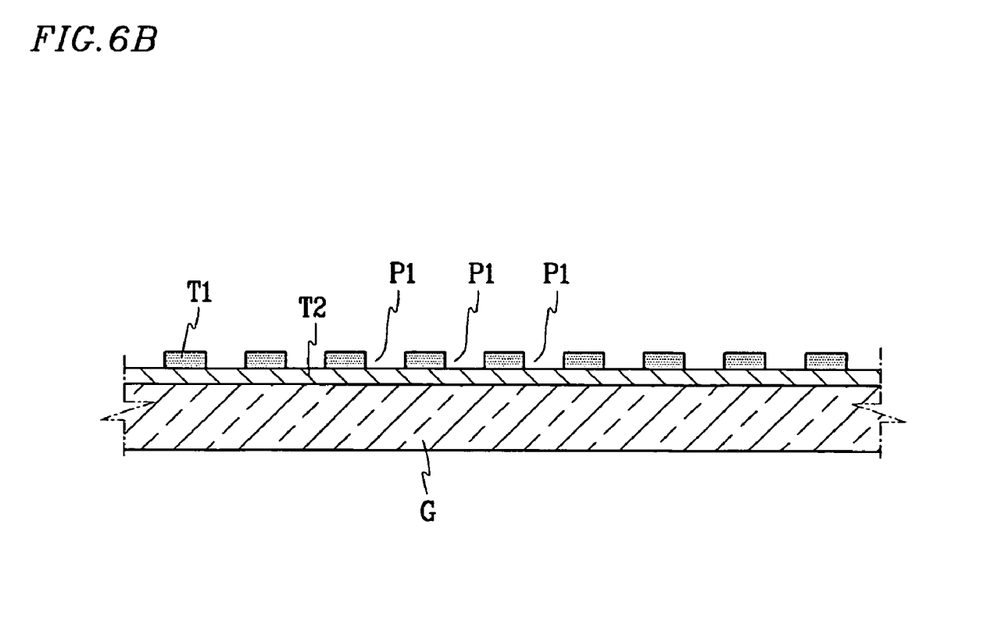
FIG. 6B is a sectional view of a substrate before an imprint process is performed.

That is, as shown in FIG. 6A, the photosensitive polymer resin is applied to the wiring layer T2 of the substrate to form the photosensitive organic layer T1. Then, the substrate G is loaded on the stage 2 disposed in the chamber 1.

As described above, when the substrate G is loaded on the stage 2, the control unit controls the substrate G such that the substrate G is aligned with the template 4 to align the imprint location.

When the alignment of the substrate G is finished, the driving unit 6 ascends the stage 2 toward the template 4 to perform the imprint process.

The driving unit may be formed of a cylinder or a motor assembly.

By the ascending of the stage 2, the substrate G loaded on the stage contacts the template 4 and is imprinted such that the pattern formed on the template is formed on the substrate. When the lamp irradiates the light on the substrate G, the imprinted pattern is hardened.

At this point, the pressure applied to the substrate when the substrate G contacts the template 4 by the ascending of the stage 2 is uniformly distributed by the fluid filled in the stage 2.

Figure 5:
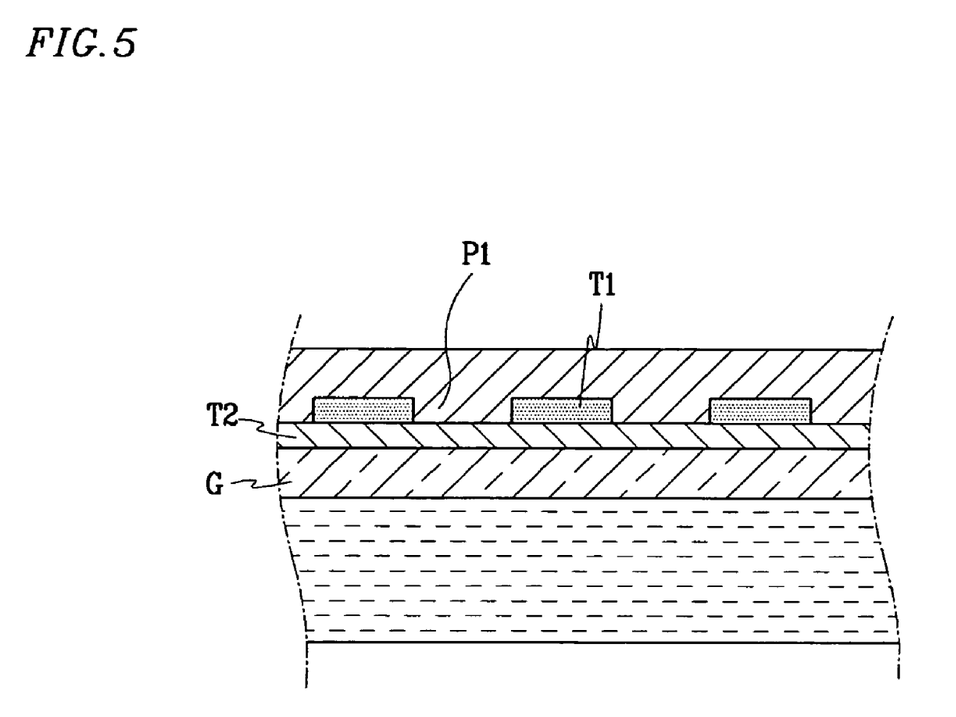
FIG. 5 is a sectional view illustrating a portion "B" of FIG. 4.

Therefore, since the substrate G is uniformly applied with the pressure to elastically contact the bottom of the mold, the pressure is uniformly distributed on the organic layer T1 of the substrate G, and the fine pattern P1 of the mold is transferred to the substrate G.

Particularly, the imprint operation of the mold minimizes the generation of bubbles on the contact surfaces of the organic layer T1 of the substrate G and the mold.

According to the present invention, since the fine pattern forming apparatus is designed to support the substrate using buoyancy, the template is imprinted in the photosensitive liquid on the substrate in a state where the uniformity is obtained, thereby stably forming the fine pattern.

In addition, since the imprint process is automated, the fine pattern can be effectively formed.

It will be apparent to those skilled in the art that various modifications and variations can be made in the present invention. Thus, it is intended that the present invention covers the modifications and variations of this invention provided they fall within the scope of the appended claims and their equivalents.

What is claimed is:

1. An apparatus for forming a fine pattern, comprising:
a chamber having a predetermined process space;
a stage for supporting a substrate on which a photosensitive organic layer is formed, using buoyancy, the stage having a top opening and an inner space in which fluid can be filled;

a clamp extending round the opening of the stage for fixing the substrate to the stage;

a template disposed away from the stage to imprint a pre-process pattern dividing etching and non-etching regions on the organic layer of the substrate; and a driving unit for moving the stage toward the template so that the pattern formed on the template can be formed on the organic layer of the substrate.

2. The apparatus of claim 1, further comprising a light emitting unit for irradiating light to the substrate and the template, the light emitting unit being provided above the template.

3. The apparatus of claim 1, wherein a plate is disposed on the fluid through the top opening.

4. The apparatus of claim 1, wherein the chamber includes an intake portion though which gas is injected and an exhaust portion for forming a vacuum inside of the chamber by exhausting the gas, a transparent window through which light passes, and a plurality of frames supporting the chamber.

5. The apparatus of claim 1, further comprising a control unit for aligning the substrate with the stage.

6. The apparatus of claim 4, further comprising a correction unit for correcting the stage along X, Y, and θ-axes.

7. The apparatus of claim 1, wherein the template comprises a mold on which the fine pattern is formed and a mold fixing panel for fixing the mold.

8. The apparatus of claim 2, wherein the light emitting unit comprises a UV lamp.

\* \* \* \* \*